United States Patent
Moser et al.

(10) Patent No.: US 6,721,348 B2
(45) Date of Patent: Apr. 13, 2004

(54) INDIUM PHOSPHIDE-BASED VERTICAL-CAVITY SURFACE-EMITTING LASER

(75) Inventors: Michael Moser, Baden (CH); Guilhem Almuneau, Aesch bei Birmensdorf (CH)

(73) Assignee: Avalon Photonics AG, Zurich (CH)

( * ) Notice: Subject to any disclaimer, the term of this patent is extended or adjusted under 35 U.S.C. 154(b) by 0 days.

(21) Appl. No.: 10/244,343

(22) Filed: Sep. 16, 2002

(65) Prior Publication Data

US 2003/0103543 A1 Jun. 5, 2003

(30) Foreign Application Priority Data

Sep. 18, 2001 (EP) .............................................. 01122286

(51) Int. Cl.[7] .............................. H01S 3/08; H01S 5/00
(52) U.S. Cl. ........................................... 372/96; 372/45
(58) Field of Search ........................ 372/96, 45; 257/98

(56) References Cited

U.S. PATENT DOCUMENTS

| | | | | |
|---|---|---|---|---|
| 5,018,157 A | * | 5/1991 | Deppe et al. | 372/45 |
| 5,351,256 A | * | 9/1994 | Schneider et al. | 372/45 |
| 5,991,326 A | * | 11/1999 | Yuen et al. | 372/96 |
| 6,207,973 B1 | * | 3/2001 | Sato et al. | 257/98 |
| 6,238,944 B1 | * | 5/2001 | Floyd | 438/45 |

FOREIGN PATENT DOCUMENTS

JP          11-54830          2/1999

OTHER PUBLICATIONS

Qian et al; 1.3 μm Vertical–Cavity Surface–Emitting Lasers with Double–Bonded GaAs–AlAs Bragg Mirrors; IEEE Photonics Technology Letters, vol. 9, No. 1, Jan. 1997.

S. Rapp et al; All–Epitaxial Single–Fused 1.55 μm Vertical Cavity Laser Based on an InP Bragg Reflector; Jpn J. Appl. Phys, vol. 38 (1999) pp. 1261–1264, no month.

Uchiyama et al; GaInAsP/InP SBH surface emitting laser with Si/Al$_2$O$_3$ mirror; Electronics Letters, Aug. 17, 1995, vol. 31, No. 17.

Piprek et al; Loss Analysis of 1.55μm Vertical Cavity Lasers; University of Delaware Materials Science, Newark DE 19716.

Deng et al; Oxide–confined vertical–cavity laser with additional etched void confinement; Electronic Letters, May 9, 1996, vol. 32, No. 10.

Larson et al; Room temperature continuous–wave photo-pumped operation of 1.22 μm GaInNas/GaAs single quantum well vertical–cavity surface–emitting laser; Electronics Letters, May 22, 1997, Vo.. 33, No. 11, p. 959.

Streubel et al; Room–Temperature Pulsed Operation of 1.5 μm Vertical Cavity Lasers with an In–P Based Bragg Reflector; IEEE Photonics Technology Letters, vol. 1, No. 9, Sep. 1996.

(List continued on next page.)

*Primary Examiner*—Paul Ip
*Assistant Examiner*—Hung Vy
(74) *Attorney, Agent, or Firm*—Fattibene & Fattibene; Paul A. Fattibene; Arthur T. Fattibene

(57) ABSTRACT

A vertical-cavity surface-emitting laser comprises one or more quantum well layers and one or more barrier layers to define an gain region, a first mirror means and a second mirror means, wherein the first and second mirror means define a resonator. Moreover, the vertical-cavity surface-emitting laser further comprises a first indium phosphide layer adjacent to the gain region and a second indium phosphide layer adjacent to the gain region to define a laser cavity.

35 Claims, 4 Drawing Sheets

OTHER PUBLICATIONS

Gebretsadik et al; InP–based 1.5 $\mu$m vertical cavity surface emitting laser with epitaxially grown defect–free GaAs–based distributed Bragg reflectors; Electonics Letters, Jun. 25, 1998, vol. 34, No. 13, p. 1316–1318.

Black et al; Double–fused 1.55 $\mu$m vertical cavity lasers with record high $T_o$ of 132K at room temperature; Electronics Letters, Oct. 1, 1998, vol. 34, No. 20.

Hall et al; Electrically–pumped, single–epitaxial VCSELs at 1.55 $\mu$m with Sb–based mirrors; Electronics Letters, Aug. 5, 1999, vol. 35, No. 16; pp. 1337–1338.

Uchiyama et al; Continuous–Wave Operation up to 36°C. of 1.3–$\mu$m GaInAsP–InP Vertical–Cavity Surface–Emitting Lasers; IEEE Photonics Technology Letters, vol. 9, No. 2, Feb. 1997.

Sekiguchi et al; Self–aligned current confinement structure using AlAs/InP tunnel junction in GaInAsP/InP semiconductor lasers; Applied Physics Letters; vol. 75, No. 11, Sep. 13, 1999; pp. 1512–1514.

Almuneau et al Improved Electrical and Thermal Properties of InP–AlGaAsSb Bragg Mirros for Long–Wavelength Vertical–Cavity Lasers; IEEE Photonics Technology Letters, vol. 12, No. 10, Oct. 2000; pp. 1322–1324.

Babic; et al; Room–Temperature Continuous–Wave Operation of 1.54 $\mu$m Vertical–Cavity Lasers; IEEE Photonics Technology Letters, Nov. 7, 1995.

* cited by examiner

INDIUM PHOSPHIDE-BASED VERTICAL-CAVITY SURFACE-EMITTING LASER

FIELD OF THE INVENTION

The present invention relates to a vertical-cavity surface-emitting laser (VCSEL) comprising one or more quantum well layers and first and second mirror means defining a laser cavity therebetween.

BACKGROUND OF THE INVENTION

A VCSEL is a semiconductor laser device including one or more semiconductor layers exhibiting an appropriate band gap structure to emit light in a desired wavelength range perpendicularly to the one or more semiconductor layers. Typically, the thickness of a corresponding semiconductor layer is in the range of a few nanometers. In the case of a multi-quantum well laser, the thickness and the strain created during the formation of the stack of semiconductor layers having, in an alternating fashion, a different gap determine the position of the energy level in the quantum wells of the conduction bands and valence bands defined by the layer stack. The position of the energy levels defines the wavelength of the radiation that is emitted by recombination of an electron-hole-pair confined in the respective quantum wells. Contrary to edge emitting semiconductor laser devices, the current flow and the light propagation occurs in a vertical direction with respect to the semiconductor layers. Above and below the semiconductor layers respective mirrors, also denoted as top and bottom mirrors, wherein the terms "top" and "bottom" are exchangeable, are provided and form a resonator to define an optical cavity. The laser radiation established by the resonator is coupled out through that mirror having the lower reflectivity.

Although VCSEL devices suffer from relatively low output power due to their small laser cavity, VCSELs are steadily gaining in importance in a variety of technical fields, since a VCSEL device exhibits a number of advantages when compared to a conventional double heterostructure laser diode, also referred to as edge-emitting lasers. First, a large number of VCSEL devices can be fabricated and entirely tested on the initial substrate, so that a significant reduction in manufacturing costs is obtained compared to edge-emitting lasers. Second, the overall volume of a single VCSEL device is reduced by a factor of about 10–100 compared to the double heterostructure laser diode. Third, due to the extremely small volume of the gain region that is defined in the vertical direction by the thickness of the semiconductor layers having in alternating fashion a different band gap, the current for operating the VCSEL device is in the range of a few milliampers, whereby a high efficiency of conversion of current into light is achieved. Fourth, a further VCSEL device exhibits a relatively low beam divergence, which allows a high coupling efficiency to other optical components, such as optical fibers, without the necessity of additional converging optical elements.

In order to take full advantage of the characteristics of a relatively small gain volume of VCSEL devices, the mirrors defining the laser cavity and usually provided in the form of Bragg mirrors must exhibit a high reflectivity owing to the small optical length of the gain volume, since resonator losses are inversely proportional to the resonator length, good electrical conductivity, since at least a portion of the injection current is lead through the layer stack of the Bragg mirror, and a low thermal resistance to conduct the heat generated in the gain region to the periphery of the VCSEL device. Presently a huge variety of VCSEL devices formed on a gallium arsenide (GaAs) substrate comprising gallium arsenide-aluminum arsenide (GaAs/AlAs) based Bragg mirrors are commercially available, wherein the Bragg mirrors substantially fulfill the above-mentioned criteria. These commercially available VCSEL devices are adapted to operate in a wavelength range of about 850–980 nm. Laser devices operating in this wavelength range are suitable for a variety of applications, including short-haul applications in data communication systems. For usage of VCSEL devices in combination with long-haul fiber optical cables, the operation wavelength of the VCSEL devices has to be increased to about 1.3–1.55 $\mu$m, since the typically employed optical fibers exhibit their dispersion minimum and their absorption minimum, respectively, at the wavelength of 1.3 $\mu$m and 1.55 $\mu$m. Modification of standard VCSEL devices operating in the wavelength range below 1 $\mu$m, however, for the required long wavelength range is not a straightforward development, since formation of adequately defined quantum wells with materials that are lattice-matched to GaAs require a highly-strained semiconductor layer, thereby rendering the VCSEL devices obtained as unreliable. Therefore, commonly employed semiconductor compounds that are lattice-matched to indium phosphide are used for semiconductor laser devices operating at a wavelength of 1.3–1.55 $\mu$m, wherein, however, the complex technology developed for GaAs-based substrates may not be directly transferred to indium-phosphide (InP) based VCSEL devices.

In view of the above-identified problems, a great effort has been made to realize a VCSEL device operating in the long wavelength range and exhibiting a relatively high output power combined with a good temperature stability. In order to meet these requirements, some serious problems have to be solved.

First, traditional indium-phosphide based materials used as an gain region in a long wavelength VCSEL device do not provide sufficient contrast in refractive index to allow the fabrication of highly reflective distributed Bragg reflectors required for the proper operation of the VCSEL device. Due to the reduced volume of the gain region of the resonator combined with not high-enough reflective mirrors, an increased operating current is required to obtain a stimulated emission. To date, therefore, only pulsed operation at room temperature is achieved.

Second, photon absorption by free charge carriers, i.e., by charge carriers that can "freely" move within the conduction band or the valency band, increases with wavelength of the photons as well as with the charge carrier concentration. In particular, in a semiconductor laser relatively high charge carrier concentrations are required which will, in combination with the longer wavelength of the photons, therefore limit the maximum achievable mirror reflectivity owing to the increased absorption of the semiconductor layers forming the Bragg reflectors.

Third, as is known from edge-emitting lasers GaInAsP (gallium/indium/arsenic/phosphorous) has a poorer gain versus temperature performance than a GaAs-based gain region due to a reduced carrier confinement and increased Auger recombination.

To overcome these technological challenges, two approaches have been proposed. The first approach involves hybrid structures that use InGaAsP/InP or InGaAs/InGaAlAs quantum wells/barriers-based gain regions and mirrors formed by depositing dielectrics or growing semiconductor materials by epitaxy. Presently, the most promising long wavelength VCSEL devices have been manufactured by wafer fusion of a wafer bearing an InGaAsP gain region and a wafer bearing AlGaAs based distributed Bragg reflectors. The wafer fusion technique, however, requires multiple substrates and is difficult to accomplish on a full wafer basis. Consequently, it is very difficult to establish a reliable fabrication process on the basis of this technology.

The second approach proposes the formation of a complete VCSEL structure in a single step by epitaxial growth. To this end, new materials appropriate for emitting at long wavelengths have been directly grown on a GaAs substrate so that AlGaAs distributed Bragg reflectors may be used in combination with these new materials forming the gain region. Emission at 1.3 $\mu$m has been shown with GaInNAs, GaAsSb quantum wells and InGaAs quantum dots. Promising wells have been obtained by using antimonide-based distributed Bragg reflectors that are lattice-matched to indium phosphide.

"Electrically-pumped single epitaxial VCSELs at 1.55 $\mu$m with Sb-based mirrors", by E. Hall et al., *Electronics Letters*, Aug. 5, 1999, Vol. 35, No. 16, pages 1337 onwards, discloses an electrically pumped Sb-based vertical-cavity laser operating at 1.55 $\mu$m which is produced in a single epitaxial growth. This VCSEL device comprises AlGaAsSb mirrors and an AlInGaAs-based gain region and exhibits a threshold current density of 1.4 kA/cm$^2$, i.e., approximately 7 mA, at room temperature. This value was obtained by a pulsed operation of the VCSEL device, wherein the threshold current increased to about 15.5 mA at a maximum operating temperature at 45° C. At higher currents, the VCSEL device exhibited a strong multi-mode behavior. Due to the relatively high voltage drop across the distributed Bragg reflectors and due to a reduced mode-gain alignment, a continuous wave operation was not feasible with this device.

In view of the above consideration, it is therefore desirable to have a VCSEL device operating in a long wavelength range at elevated temperatures well above room temperature and capable of operating in a continuous wave mode.

SUMMARY OF THE INVENTION

According to the present invention the object is solved by a vertical-cavity surface-emitting laser comprising one or more quantum well layers and one or more barrier layers to define a laser gain region having a first and a second surface, a first mirror means and a second mirror means, wherein the first and second mirror means define a resonator. The vertical-cavity surface-emitting laser is characterized in that it further comprises a first indium phosphide layer adjacent to the gain region and a second indium phosphide layer adjacent to the gain region, wherein the first and second indium phosphide layers sandwich the gain region to define a laser cavity.

In conventional double heterostructure laser diodes, the quantum well region is embedded in materials with a higher index of refraction than the surrounding claddings to form a transverse dielectric optical waveguide with its optical axis along the longitudinal direction. Currently, the same sequence of material layers forming the quantum well region is applied to VCSEL devices. Contrary to the transverse light propagation in an edge-emitting laser, however, in a VCSEL light propagation occurs substantially perpendicular to the material layers so that the waveguide function provided by the material layers of outwardly decreasing index of refraction in the transverse direction is actually not required. Therefore, a low index material can be implemented in the vertical cavity of the VCSEL as has already been demonstrated in AlGaAs-based VCSEL devices. In this known material system, however, AlAs has to be used which brings with it several disadvantages in terms of electrical conductivity, technological problems in fabricating high quality materials and, hence, in reliability. Contrary thereto, the present invention provides a laser cavity comprising an InP region sandwiching the gain region and possible barrier layers. Consequently, the inventive laser cavity allows the employment of a low index material to thereby enhance the relative intensity of the electrical field at the location of the quantum well layers which has a direct incidence on the stimulated emission rate. Accordingly, an enhanced photon generation rate can be achieved compared to a conventional cavity design.

Moreover, the first and second indium phosphide layers adjacent to the gain region provide a significantly improved thermal conductivity. In particular, at a longer wavelength, for example at wavelengths of 1.3–1.55 $\mu$m, non-radiative Auger recombinations are more dominant and the gain obtained from the quantum wells is strongly affected by any temperature increase. Since indium phosphide has a thermal conductivity of about 0.68 W/mK, the heat generated in the gain region can efficiently be distributed to the periphery of the device. This advantage provided by the present invention additionally gains in importance since only ternary or quaternary alloys can be formed in a lattice-matched fashion on an indium phosphide based substrate, wherein in conventional devices the major limitation arises from the multi-alloyed layers due to their poor thermal conductivity which is directly dependent on the number of different atoms in the lattice. Especially quaternary-based distributed Bragg reflectors grown on indium phosphide act as heat barriers, remarkably reducing the heat dissipation by means of the heat sink substrate attached to the VCSEL device. Contrary thereto, according to the present invention, the binary indium phosphide layers in the laser cavity allow to effectively transport heat to the periphery, thereby effectively circumventing the distributed Bragg reflectors acting as heat barriers.

As is well known, the appropriate alignment of energy bands of the various semiconductor layers defining the VCSEL device is a most critical issue in achieving low voltage operation and efficient current injection. To this end, the conduction band and valence band offsets represent the dominating parameters and should be adjusted to adequately small values. The indium phosphide layers in the inventive VCSEL exhibit a low band misalignment with the material systems comprising AlGaInAs, AlGaAsSb and InGaAsP, wherein, on the other hand, a sufficiently high band gap exists to allow these material systems to be efficiently used in distributed Bragg reflectors. Moreover, undoped indium phosphide offers a very high carrier mobility; a typical electron mobility is, for example, 5370 cm$^2$/Vs at 300K, and a typical hole mobility is 150 cm$^2$/Vs at 300K. These high values give rise to a long diffusion path of the charge carriers within the undoped indium phosphide layers so that the carrier injection efficiency, i.e., the portion of charge carriers injected into the VCSEL device that actually arrives at the gain region, is efficiently increased.

A further issue of quantum well structures is the leakage of carriers through the barrier layers which separate one quantum well layer from a subsequent quantum well layer or which separate the gain region from the residual optical cavity. In particular, at a higher temperature and a high carrier density, the laser performance is deteriorated due to increasing leakage currents through the barrier layers. The electrons with their smaller effective mass require a tighter confinement to the quantum well layers than the holes. According to the present invention, the first and second indium phosphide layers serving as barriers for, e.g. low band gap gain regions formed by GaInAs (gallium/indium/arsenic), AlGaInAs (aluminum/gallium/indium/arsenic), or InGaAsP (indium/gallium/arsenic/phosphorous), provide a more efficient electron confinement than is practical for conventional InGaAsP systems, thereby significantly reducing electron leakage through the barrier layer.

Another advantage of the present invention concerns the fabrication of the long-wavelength VCSEL device. Currently, indium phosphide material may be epitaxially grown substantially without defects and with a good reliability by the commonly used semiconductor epitaxy techniques, such as metal organic vapor phase epitaxy, molecular beam epitaxy, vapor phase epitaxy, and the like. During the fabrication of the distributed Bragg reflectors, however, a non-negligible amount of strain may accumulate in the epitaxial layers due to a slight lattice mismatch. According to the present invention, this strain that will adversely affect the performance of conventional devices is significantly reduced in that indium phosphide is used as the laser cavity material to absorb a large amount of the strain. Moreover, it is well known that the growth of an entire indium phosphide based VCSEL including quarternary systems is extremely critical owing to the large number of growth parameters affecting the formation of the entire structure. Consequently, the introduction of indium phosphide as a binary material during the growth of the VCSEL efficiently favors the lattice match of subsequent layers.

In a further embodiment, the VCSEL comprises one or more quantum well layers designed to have energy eigenvalues for generating radiation in the wavelength range from approximately 1000 nm to 2000 nm.

As previously noted, a laser device operating in the above-identified wavelength range may advantageously be employed in optical communication systems.

In a further embodiment, the VCSEL comprises quantum well layers that are designed to have energy eigenvalues for generating radiation in the wavelength range from approximately 1300–1600 nm.

In particular, this wavelength range allows the VCSEL of the present invention to be used in combination with conventionally designed optical fibers which exhibit a minimum dispersion and a minimum absorption at a wavelength of approximately 1300 nm and 1550 nm, respectively.

Preferably, the first and second mirror means are positioned to define a resonator to stabilize radiation of the wavelength of approximately 1300 nm or of approximately 1550 nm.

As previously noted, these two wavelengths are the commonly preferred wavelengths in optical data communication systems using optical fibers.

In a further embodiment, an optical thickness of the laser cavity in the longitudinal dimension is approximately $(n+\frac{1}{2}) \times \lambda$, wherein n is an integer number and $\lambda$ is the approximate output wavelength of the VCSEL device.

By forming the laser cavity, with an optical length of approximately $(n+\frac{1}{2}) \times \lambda$, substantially being comprised of indium phosphide layers surrounding the quantum well layers located at the center of the cavity, the relative intensity of the electrical field within the laser cavity is significantly enhanced at the position of the quantum well layers. As will be discussed in more detail in the following description, the application of an $(n+\frac{1}{2}) \times \lambda$ laser cavity having a relatively low index of refraction due to the first and second indium phosphide layers favors a higher electrical field in the quantum well layers compared to the neighboring intensity peaks of the electrical field at the first high-to-low refractive index transitions of the first and second mirrors. Contrary to this, the employment of material layers of high index of refraction in the laser cavity will distribute the amplitudes of the intensity peaks of the electrical field more evenly between the quantum well layers disposed at the center of the cavity and the first high-to-low refractive index transitions of the distributed Bragg reflectors. Accordingly, a significantly less efficient stimulated emission rate in the quantum well layers and, thus, a significantly lower gain will be obtained. In conventional VCSEL designs using high-index layers in the laser cavity, this problem becomes even more exacerbated since in known laser devices an $(n \times \lambda)$ cavity is commonly used, thereby resulting in an electrical field at the centered quantum well layers, which has a smaller intensity than the electrical field located at the cavity edges.

A further advantage of designing the laser cavity to have an optical length of approximately $(n+\frac{1}{2}) \times \lambda$ is that a minimum intensity of the electrical field prevails at the inter-face between the laser cavity and the first and second mirrors. When the first and second mirrors are attached to the laser cavity by wafer fusion, due to the minimum of the intensity of the electrical field the effects of the losses that could be present at the fused region are minimized, and thus the performance and the reliability of the fused VCSEL is significantly enhanced.

In a further embodiment, the VCSEL device further comprises a substrate supporting the quantum well layers, the laser cavity, and the first and second mirror means. Maintaining a substrate on which the VCSEL device is formed ensures increased mechanical stability.

In a further embodiment, the substrate is substantially an indium phosphide substrate.

In this case, the indium phosphide based quantum well layers and the first and the second indium phosphide layers in the laser cavity can readily be formed in a lattice-matched fashion, thereby minimizing the strain in the various material layers.

In a further embodiment, the substrate is substantially a gallium arsenide substrate that allows the growth of AlGaAs-based distributed Bragg reflectors as in conventional devices.

In one embodiment, the one or more quantum well layers are formed of a material composition including indium, gallium and arsenic.

As will be discussed later, quantum wells comprising indium, gallium and arsenic may advantageously be grown on an indium phosphide substrate or on a GaAs substrate, and this type of quantum well may readily be combined with high refractive index/low refractive index layer pairs for forming a distributed Bragg reflector as a monolithic structure.

In a further embodiment, the material composition of the one or more quantum well layers comprises aluminum to adjust characteristics of the quantum well layers in accordance with design requirements.

By adding aluminum to the quantum well layers, corresponding properties of the quantum well layers, such as refractive index and electronic characteristics, can be controlled.

In a further embodiment, the material composition further comprises phosphorous to adjust characteristics of the quantum well layers in conformity with design requirements.

Similarly, optical and electronic characteristics of the quantum well layers may be controlled by adding phosphorous to the quantum well layer.

Preferably, the VCSEL device comprises a pair of barrier layers arranged to sandwich the one or more quantum well layers.

In one embodiment, the barrier layer comprises indium phosphide or a compound of indium, gallium, aluminum, arsenic or a compound of indium, gallium, arsenic, phosphorous.

These material compositions provide an efficient lattice-matching to the first and second indium phosphide layers in the laser cavity.

Preferably, the first and/or the second mirror means comprise layers of low refractive index and high refractive index in an alternating fashion.

As previously noted, providing distributed Bragg reflectors within the first and second mirrors assists in achieving a high reflectivity of the first and second mirrors, to thereby obtain a large effective optical length of the resonator.

In a further embodiment, the layers of low refractive index comprise indium phosphide or a compound of indium, aluminum, arsenic, or a compound of aluminum, arsenic, antimony or a compound of aluminum, phosphorous, antimony.

Thus, the low refractive index layers forming the distributed Bragg reflectors may readily be formed on an indium phosphide substrate or an indium phosphide based laser cavity.

In one illustrative embodiment, the low refractive index layer additionally comprises gallium to adjust the characteristics in accordance with design requirements.

By adding gallium, optical as well electronic characteristics of the low refractive index layers may be adjusted in accordance with properties required for an optimum performance of the VCSEL device.

In one embodiment, the layers of low refractive index comprise aluminum arsenide.

According to this embodiment, standard processes developed for VCSEL devices having Bragg reflectors for output wavelengths in the range of 700–980 nm may readily be adapted to the VCSEL device of the present invention.

In one embodiment, the layers of low refractive index additionally comprise gallium to adjust the characteristics in accordance with design requirements.

Accordingly, the optical characteristics as well as the solid state behavior of the low refractive index layers may properly be adjusted by adding gallium.

In a further embodiment, the layers of high refractive index comprise a compound of indium, gallium, aluminum, arsenic or a compound of indium, gallium, arsenic, phosphorous or a compound of aluminum, gallium, arsenic, antimony or a compound of aluminum, gallium, phosphorous, antimony.

As in the case of the low refractive index layers, according to this embodiment the high refractive index layer may readily be formed on an indium phosphide substrate or on an indium phosphide based laser cavity.

In a further embodiment, the layers of high refractive index comprise a compound of gallium and arsenic.

Again, according to this embodiment, the well-established techniques for distributed Bragg reflectors on the basis of gallium arsenide may be employed by forming the VCSEL device according to the present invention.

In a further embodiment, the layers of high refractive index additionally comprise aluminum to adjust characteristics in conformity with design requirements.

In a further embodiment, the layers of low refractive index and the layers of high refractive index are formed of dielectric materials.

In a further embodiment, the layers of high refractive index comprise tantalum oxide, zinc selenide, titanium dioxide, or amorphous silicon. In addition the layers of low refractive index may comprise magnesium fluoride, calcium fluoride, strontium fluoride, silica or aluminum oxide.

According to the above-cited embodiments using dielectric materials, the optical properties of the first and second mirrors may be optimized to obtain the required high reflectivity with a minimum number of layers.

In a yet another embodiment, the VCSEL further comprises one or more heat distribution layers to transversely conduct heat from the quantum well layers to the periphery of the VCSEL device.

Providing heat distribution layers effectively enhances the efficiency of the laser device and additionally provides for an increased stability and reliability during operation of the device.

In one embodiment, at least one heat distribution layer is formed adjacent to the laser cavity.

This ensures efficient heat conduction from the laser cavity to the periphery of the device.

In one embodiment, the one or more heat distribution layers comprise indium phosphide.

As previously explained, indium phosphide comprises a high heat conductivity so that indium phosphide layers may effectively be used as heat distribution layers. Especially the first and second indium phosphide layers in the laser cavity effectively contact heat generated at the center of the VCSEL device by the quantum well layers to the periphery of the device, and thus allow a reliable continuous wave (cw) operation of the device.

In one illustrative embodiment, one or more heat distribution layers are formed in the first mirror means and/or in the second mirror means.

According to this embodiment, variations of the optical characteristics of the first and/or the second mirrors can be efficiently minimized by introducing one or more heat distribution layers into the first and/or second mirrors. In particular, when the first and/or the second mirrors are distributed Bragg reflectors based on commonly used compounds containing indium, the heat conductivity of such layers is significantly smaller than of ternary compounds. In this case, disposing one or more heat distribution layers, for example in the form of a binary indium phosphide layer, significantly enlarges the overall heat conductivity of a correspondingly formed distributed Bragg reflector.

Further objects, advantages and embodiments of the present invention follow from the dependent claims and the detailed description.

DETAILED DESCRIPTION OF THE INVENTION

Figure 1:
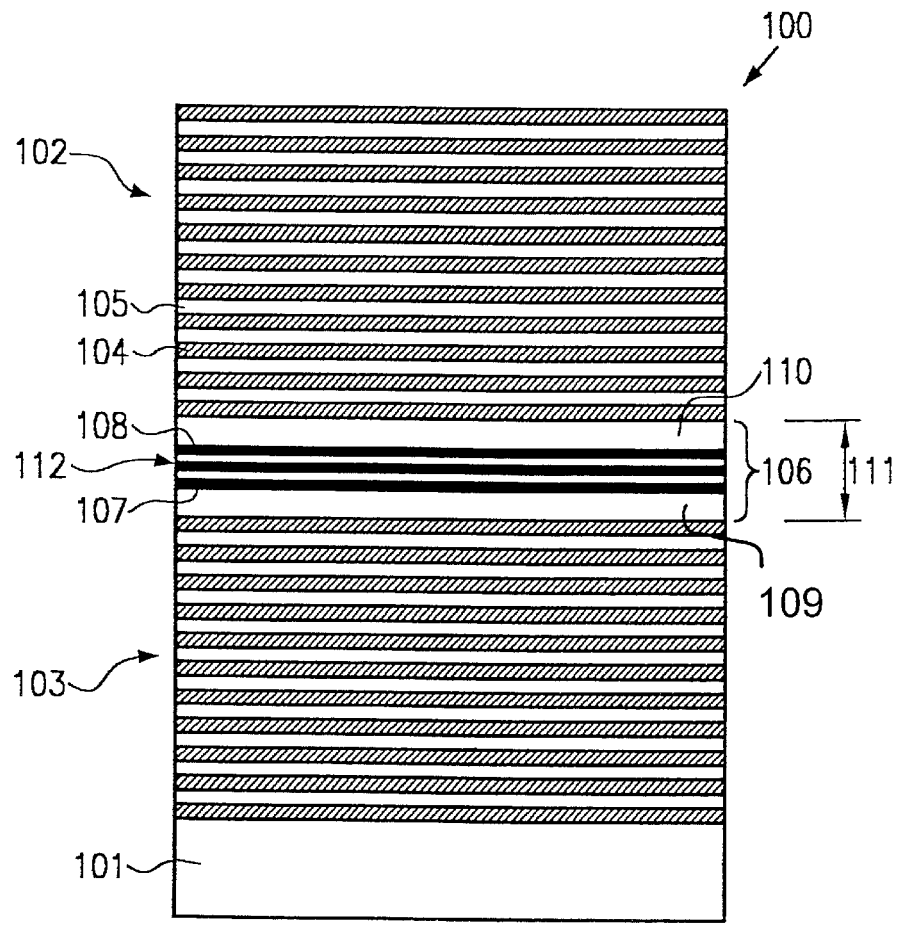
FIG. 1 shows a schematic cross-sectional view of a VCSEL device with an indium phosphide based cavity that is capable of emitting light in the wavelength range of 1000–2000 nm.

FIG. 1 schematically shows a cross-sectional view of the relevant portions of a VCSEL device according to the present invention. In FIG. 1, a VCSEL 100 comprises a substrate 101, such as an indium phosphide substrate or a GaAs substrate on which a first mirror means 103, also referred to as bottom mirror, is formed. It should be noted that terms such as "bottom", "top", "vertical", "horizontal" herein used are not intended to describe an absolute position or direction, but rather merely describe the position of certain elements or directions with respect to the substrate 101. A second mirror means 102, also referred to as top mirror, is formed over the bottom mirror 103 and defines therewith an optical resonator. The top and bottom mirrors 102, 103 are formed as distributed Bragg reflectors comprising a plurality of layers 105 exhibiting a low index of refraction, and a plurality of layers 104 exhibiting a high index of refraction. The low index layers 105 and the high index layer 104 are stacked in an alternating fashion, wherein the difference in refractive index of the low index layers 105 and the high index layers 104 dictate the required number of layers to obtain a high reflectivity of the top and bottom mirrors 102, 103 to an amount as is necessary for effectively operating the device 100. Between the top and bottom mirrors 102, 103, an gain region 106 is formed comprising one or more quantum well layers 107 separated, in case a plurality of quantum layers is provided as in the example illustrated in FIG. 1, by a plurality of barrier layers 108. At the bottom side of the at least one quantum well layer 107 and the barrier layers 108, forming in combination the gain region 106, a first indium phosphide layer 109 is formed. On the top side of the gain region 106, a second indium phosphide layer 110 is provided. The first and second indium phosphide layers 109, 110 and the gain region 106 that comprises the at least one quantum well layer 107 and the barrier layers 108 define a laser cavity 112 of the VCSEL 100. By "defining the laser cavity 112", it is intended to enclose embodiments that additionally comprise further material layers having a thickness that is small compared to the thickness of the first and second indium phosphide layers 109, 110, so that the optical and the further solid state characteristics such as refractive index, band gap energy, carriers mobility, heat conductivity and the like, of the laser cavity 112 outside of the gain region 106 are substantially determined by the first and second indium phosphide layers 109, 110.

According to one particular embodiment, the optical length of the laser cavity 112, denoted by reference number 111, is selected to substantially coincide with ½ or (n+½) times the wavelength for which the VCSEL device 100 is designed, wherein n is an integer number.

Figure 2A:
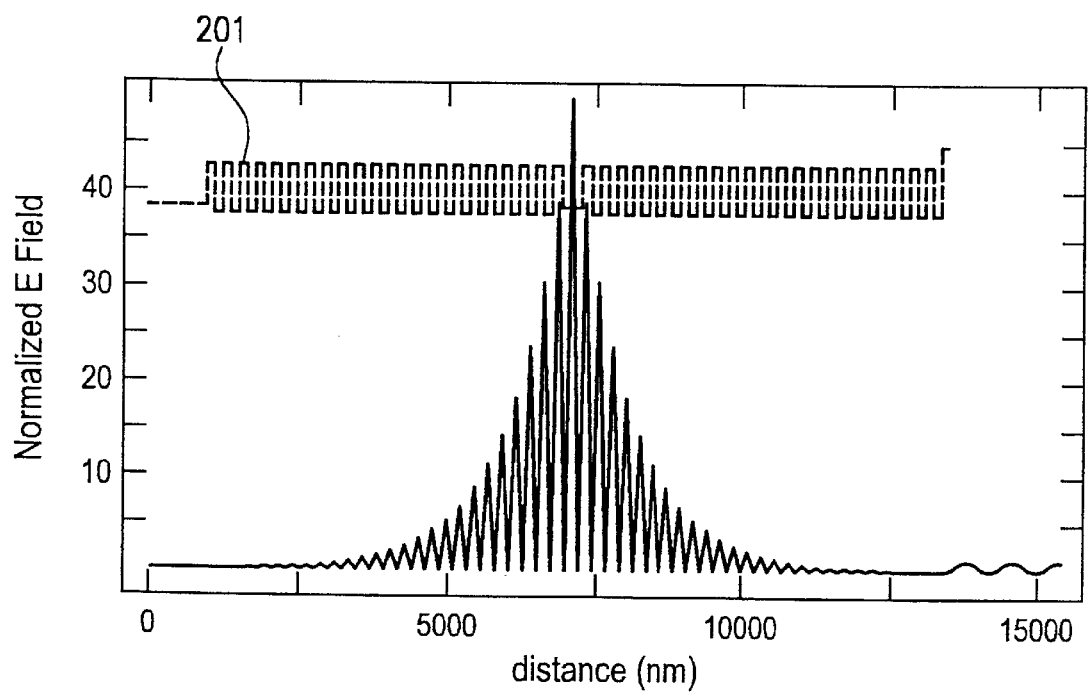
FIGS. 2a–2c represent the results of calculations of the intensity of the electrical field standing wave in a VCSEL, relating to a laser cavity with a low index of refraction with an optical length of (½×λ) (FIG. 2a), a laser cavity with high index of refraction and an optical length of (½×λ) (FIG. 2b) and a laser cavity with high index of refraction with an optical length of (1×λ) (FIG. 2c) as is commonly used in conventional VCSEL devices.
Figure 2A:
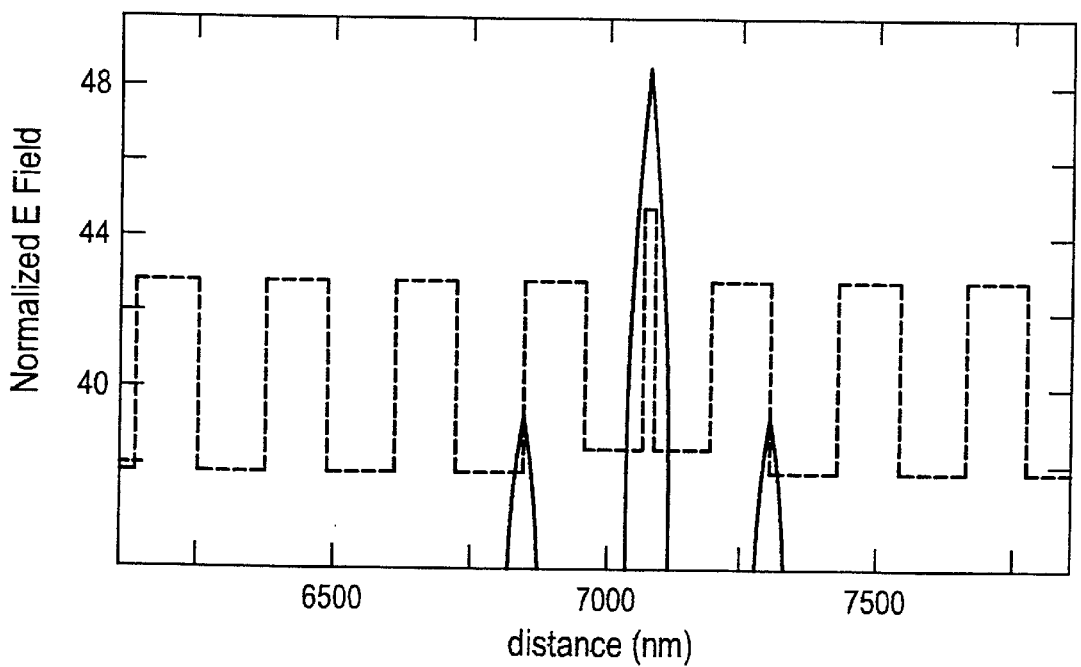
Figure 2B:
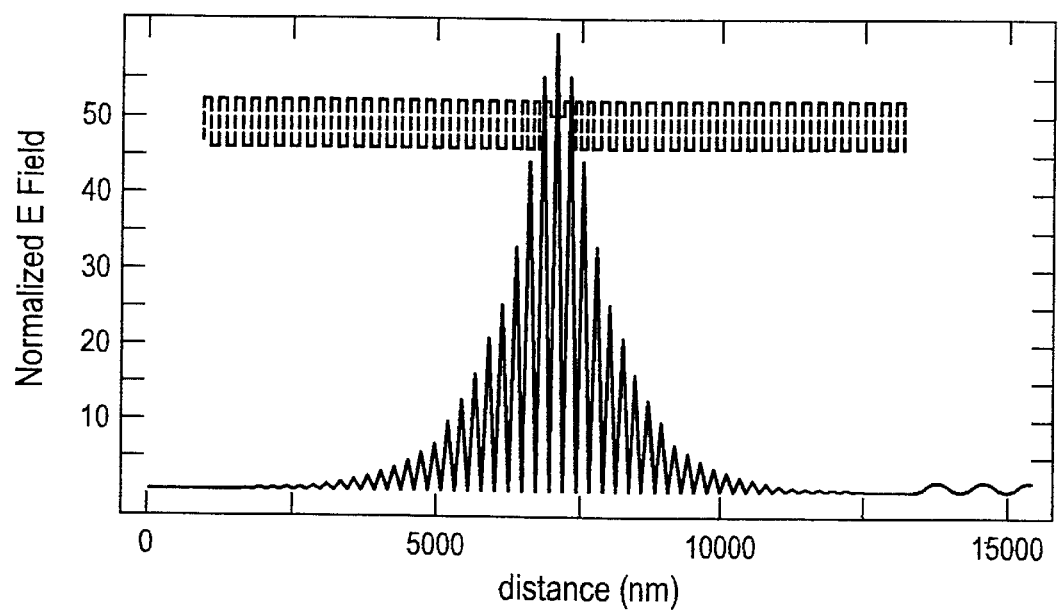
Figure 2B:
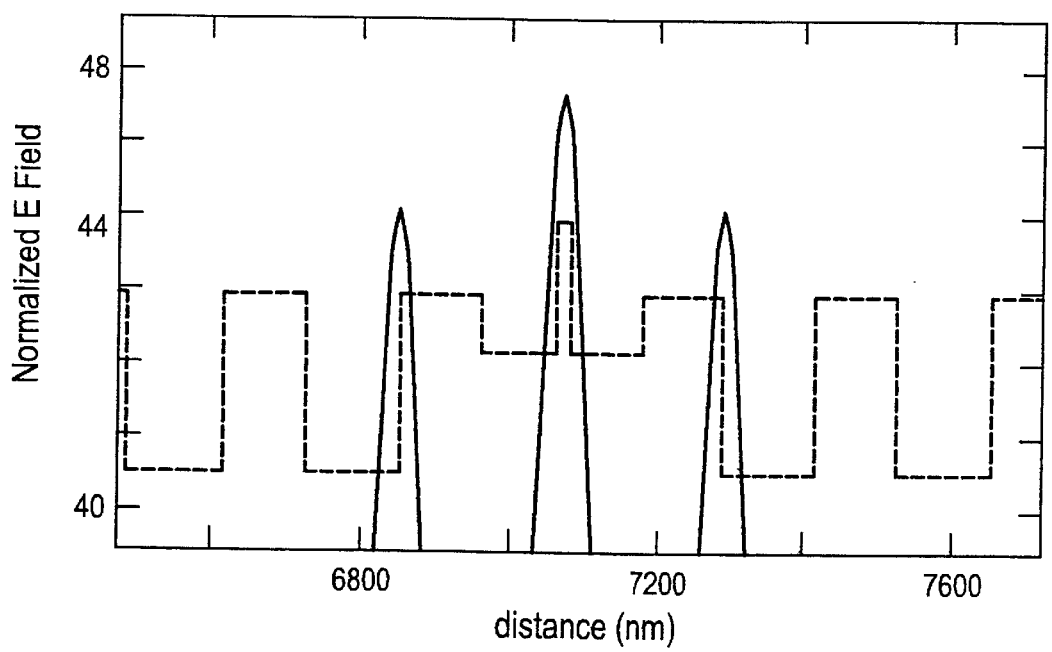
Figure 2C:
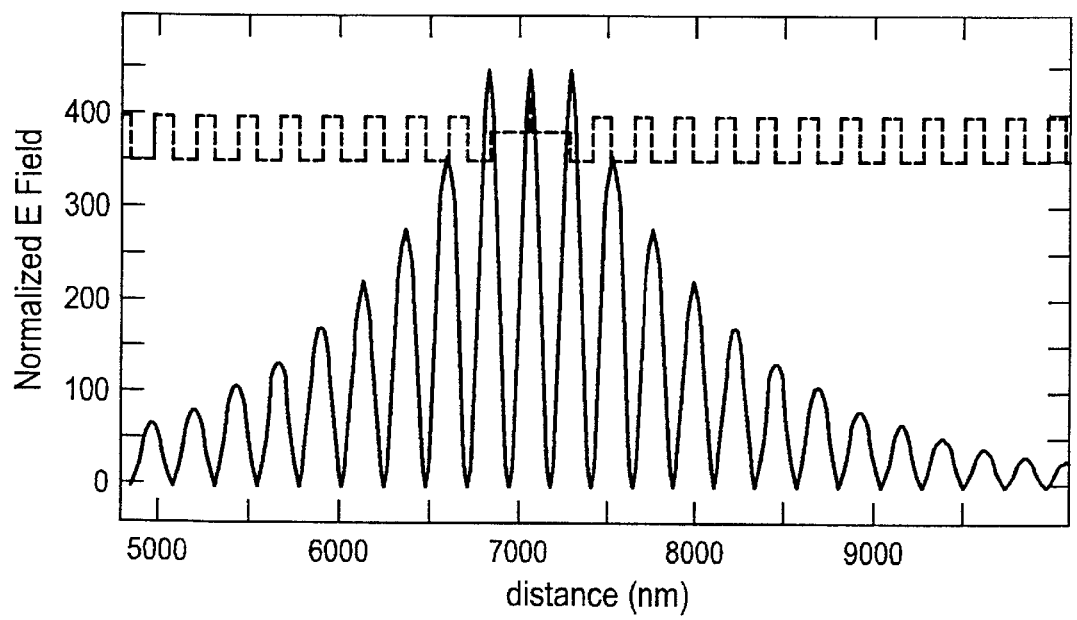
Figure 2C:
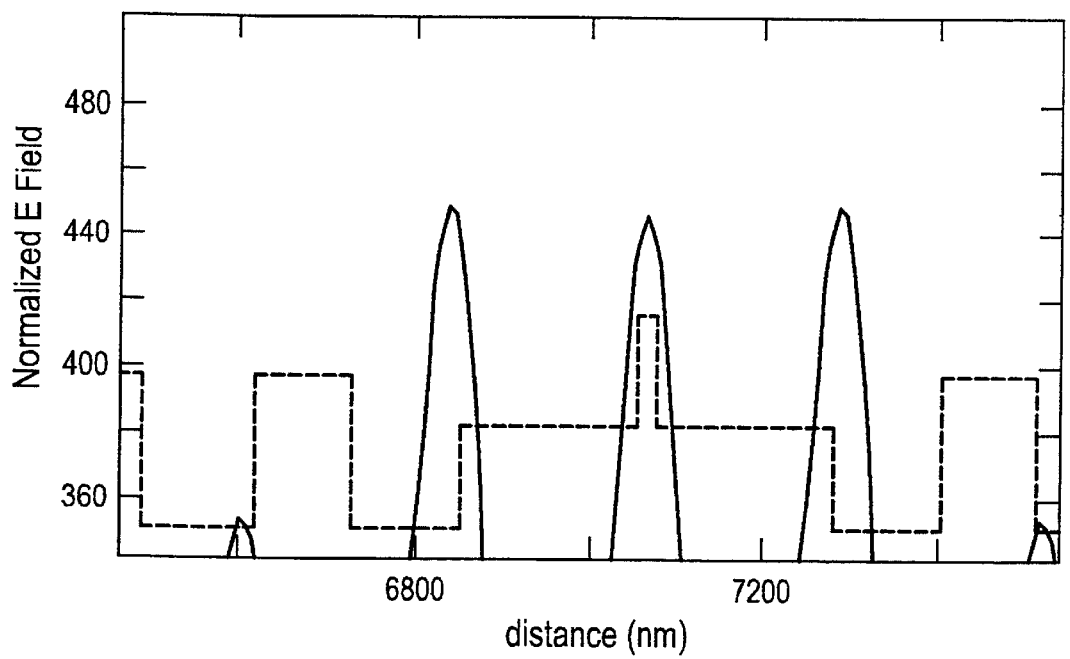

The reason for the superior characteristics of the laser cavity 112 exhibiting an optic length of substantially (n+½)×λ will be explained with reference to FIGS. 2a–2c. FIGS. 2a–2c show respective results of calculations for the longitudinal distribution of the intensity of the standing wave of the electrical field within the VCSEL 100 for different types of laser cavities.

In FIG. 2a, the upper part of the diagram illustrates the square of the electrical field standing wave within the optical resonator formed by the top mirror 102 and the bottom mirror 103 (y-axis) versus the longitudinal distance within the resonator in nanometers starting from the top of the substrate (x-axis). Additionally, the inset 201 in FIG. 2a represents the refractive index of the layers of the VCSEL 100, comprising from the left to the right of the diagram: the upper part of the substrate 101, the bottom mirror 103 formed by 25.5 alternances of high index layers 104 and low index layers 105, the laser cavity 112 formed by the indium phosphide layers 109 and 110 surrounding the gain region 106, and the top mirror 102 formed by 20.5 alternances of high index layers 104 and low index layers 105. The calculations of the longitudinal distribution of the electrical field, the results of which are depicted in FIG. 2a, are conducted with the assumption of a laser cavity 112 having an optical length of ½×λ, wherein λ is the design wavelength of the VCSEL 100, which in the present case is selected to 1550 nm. Furthermore, the gain region 106 is represented by a layer having a thickness of 60 nm and a refractive index that is slightly larger than the refractive index of the low-index layer 105 forming the top and bottom Bragg reflectors 102 and 103. The optical thicknesses of the low index layers 105 and of the high index layer 104 are selected to substantially coincide with one quarter of the wavelength for which the VCSEL device 100 is designed. Moreover, the thickness of the first and second indium phosphide layers 109 and 110 are selected to yield, in combination with the thickness of the gain region 106, an optical length of one-half of the design wavelength. It should be noted that the results show in FIG. 2a may readily be generalized to a wavelength of (n+½)×λ. Moreover, the index of refraction of the first and second indium phosphide layers 109 and 110 is assumed to be approximately 3.17 for the design wavelength. As can be seen from FIG. 2a, the maximum intensity of the electrical field is centered about the location of the gain region 106, in the present example, at a distance from the top of the substrate of 6075 nm. The lower part of FIG. 2a is an enlarged view of the central portion of the calculation results shown in the upper graph. From this graph, it is also evident that the refractive index of the first and second indium phosphide layers 102 and 103 is only slightly larger than the refractive index of the low index layers 105 of the top and bottom mirrors 1-02 and 103 so that contrary to conventional devices the laser cavity 112 is a low-index cavity. In this example, the different between the indices of refraction of the high-index layers 104 and the low-index layers 105 is assumed to 1.4 and the number of layer pairs of the top and bottom mirrors 102, 103 is 20.5 and 25.5, respectively.

The results explicitly demonstrate that the maximum intensity of the electrical field is located at the location of the gain region 106, whereas the intensity of the electrical field at the first high-to-low refractive index transition of the top and bottom mirror 102, 103 is significantly reduced compared to the central peak. Thus, in this configuration the stimulated emission rate in the gain region 106, and hence, the net gain in the VCSEL 100, is maximized.

According to one embodiment (not shown), the top mirror 102 and/or the bottom mirror 103 may be formed by wafer fusion of the mirrors to the laser cavity 112 substantially defined by the first and second indium phosphide layers 109 and 110. In this embodiment the intensity of the electrical field at the transition from the laser cavity to the wafer-fused Bragg reflector(s) is according to the results of FIG. 2a reduced, thereby significantly decreasing optical losses that would otherwise be created at these fused inter-faces.

In contrast thereto, FIG. 2b illustrates the calculation results for a laser cavity 106 including a high index material other than the indium phosphide layers as in the present invention. It is especially evident from the large view at the right side of FIG. 2b that the intensity of electrical field at the maximum peaks is distributed more evenly from the center location of the gain region 106 to the first high-to-low refractive index transition of the top and bottom mirrors 102, 103. Even though the calculation is also performed for (½×λ) for the optical length of the laser cavity 112, the overlap of the square of the electrical field with the quantum well layers is significantly reduced compared to the embodiment of the present invention comprising the low index first and second indium phosphide layers 102 and 103. As in the particular embodiment described with reference to FIG. 2a, the results of FIG. 2b can also be generalized to a cavity length of (n+½)×λ.

FIG. 2c shows the calculation results of a VCSEL design as it is frequently encountered in the prior art, namely a VCSEL device having a high index laser cavity that is designed to substantially match the design wavelength or an integer multiple of the design wavelength. As is evident from these results, the intensity of the electrical field within the laser cavity is substantially equal at the edges of the cavity and at the location of the quantum well layers, wherein the intensity of the electrical field at the edge of the laser cavity is even slightly larger than at the center. When comparing the results shown in FIG. 2a that are in accordance with the particular embodiments of the present invention with the results for a conventional device described with reference to FIG. 2c, it is evident that the VCSEL device 100 exhibits a significantly increased gain compared to the conventional VCSEL devices.

Regarding the material composition of the quantum well layers 107 and the barrier layers 108 as well as the composition of the low-index layers 105 and the high-index layers 104 forming the top and bottom mirrors 102 and 103, a plurality of embodiments may be formed by combining the material compositions as listed in the following Table 1.

As it is evident from Table 1, for the VCSEL device 100 formed on an indium phosphide substrate or layer as a monolithic structure, the quantum well layers 107 may be formed of a compound of indium, gallium, arsenic, wherein, depending on the type of barrier layer used and the required optical and other solid state characteristics, the parameters of the quantum wells may be controlled by adding aluminum or phosphorous (cf. first three lines of Table 1). The barrier layers 108 may be formed of indium phosphide and quartenary InGaAlAs or InGaAsP compounds depending on the composition of the quantum wells. It should be emphasized that indium phosphide may act as a barrier layer, or the first and second indium phosphide layers 109 and 110 themselves may together act as barrier layers. As already explained, the relatively high band gap offset between indium phosphide and the material compositions used as quantum well layers will result in a most efficient confinement of charge carriers.

TABLE 1

| Substrate | DBR high refractive index quarter-wavelength layer | DBR low refractive index quarter-wavelength layer | Quantum-Wells | Barriers |
|---|---|---|---|---|
| a) For monolithic structures[1] | | | | |
| InP | InGaAlAs | InP | (Al)InGaAs[2] | InGaAlAs |
| InP | InGaAlAs | InP | InGaAs(P)[2] | InGaAsP |
| InP | InGaAlAs | InP | InGaAs | InP |
| InP | InGaAlAs | (Ga)InAlAs[2] | (Al)InGaAs[2] | InGaAlAs |
| InP | InGaAlAs | (Ga)InAlAs[2] | InGaAs(P)[2] | InGaAsP |
| InP | InGaAlAs | (Ga)InAlAs[2] | InGaAs | InP |
| InP | InGaAsP | InP | (Al)InGaAs[2] | InGaAlAs |
| InP | InGaAsP | InP | InGaAs(P)[2] | InGaAsP |
| InP | InGaAsP | InP | InGaAs | InP |
| InP | AlGaAsSb | (Ga)AlAsSb[2] | (Al)InGaAs[2] | InGaAlAs |
| InP | AlGaAsSb | (Ga)AlAsSb[2] | InGaAs(P)[2] | InGaAsP |
| InP | AlGaAsSb | (Ga)AlAsSb[2] | InGaAs | InP |
| InP | AlGaAsSb | InP | (Al)InGaAs[2] | InGaAlAs |
| InP | AlGaAsSb | InP | InGaAs(P)[2] | InGaAsP |
| InP | AlGaAsSb | InP | InGaAs | InP |
| InP | AlGaPSb | (Ga)AlPSb2 | (Al)InGaAs[2] | InGaAlAs |
| InP | AlGaPSb | (Ga)AlPSb2 | InGaAs(P)[2] | InGaAsP |
| InP | AlGaPSb | (Ga)AlPSb2 | InGaAs | InP |
| InP | AlGaPSb | InP | (Al)InGaAs[2] | InGaAlAs |
| InP | AlGaPSb | InP | InGaAs(P)[2] | InGaAsP |
| InP | AlGaPSb | InP | InGaAs | InP |

[1]All the above combinations can be used with different bottom and top DBRs: - top DBRs can be formed by metamorphically grown GaAs/AlGaAs.
[2]The element between the parenthesis can be added in the composition of the layer for parameters adjustments.

As denoted in Table 1, quartenary compounds of indium, gallium, aluminum, arsenic (InGaAlAs), or indium, gallium, arsenic, phosphorus (InGaAsP), or aluminum, gallium, arsenic, antimony (AlGaAsSb), and aluminum, gallium, phosphorous, antimony (AlGaPSb) may be used as the high index layer 104 in combination with low-index layers 105 formed of binary indium phosphide layers, ternary indium/aluminum/arsenic (InAlAs), aluminum/arsenic/antimony (AlAsSb) or aluminum/phosphorous/antimony (AlPSb) layers for the top and bottom mirrors 102 and 103, the characteristics of which may be adjusted by adding gallium in the low index layer 105 except for InP.

According to further embodiments, the VCSEL device 100 may be formed as a hybrid structure, that is, a structure that is formed by wafer fusion or by dielectric deposition of the high and low index layers forming the top and/or the bottom mirror 102, 103. Table 2 discloses a variety of combinations that may be employed in accordance with the present invention.

TABLE 2

| Substrate | DBR high refractive index quater-wavelength layer | DBR low refractive index quater-wavelength layer | Quantum-wells | Barriers | Remarks |
|---|---|---|---|---|---|
| b) For hybrid structures | | | | | |
| GaAs | (Al)GaAs | (Ga)AlAs | InGaAs(P) | InGaAsP | Fusion |
| GaAs | (Al)GaAs | (Ga)AlAs | InGaAs | InP | Fusion |
| GaAs | (Al)GaAs | (Ga)AlAs | (Al)InGaAs | InGaAlAs | Fusion |
| InP | Dielectric material[3]: $Ta_2O_5$, ZnSe, $TiO_2$, Si, ... | Dielectric material[3]: $MgF_2$, $CaF_2$, $SrF_2$, $SiO_2$, $Al_2O_3$ ... | InGaAs(P) | InGaAsP | Dielectric deposition |
| InP | Dielectric material[3]: $Ta_2O_5$, ZnSe, $TiO_2$, Si, ... | Dielectric material[3]: $MgF_2$, $CaF_2$, $SrF_2$, $SiO_2$, $Al_2O_3$ ... | InGaAs | InP | Dielectric deposition |
| InP | Dielectric material[3]: $Ta_2O_5$, ZnSe, $TiO_2$, Si, ... | Dielectric material[3]: $MgF_2$, $CaF_2$, $SrF_2$, $SiO_2$, $Al_2O_3$ ... | (Al)InGaAs | InGaAlAs | Dielectric deposition |

[3] The dielectric DBRs are preferably used as top DBRs while all other described combinations are still valid for the bottom DBR.

The first three lines of Table 2 denote embodiments wherein the substrate 101 is a GaAs substrate having formed thereon quantum well layers on a InGaAs basis, whereas the top and bottom mirrors are formed as conventional GaAs-AlAs based Bragg reflectors. The next three lines in Table 2 indicate embodiments using dielectric material layers as the low-index and high-index layers 105 and 104. According to particular embodiments comprising dielectric mirrors, only the top mirror 102 is formed of dielectric material layers having a high index of refraction and a low index of refraction in an alternating fashion.

A typical process flow for forming the VCSEL device 100 as illustrated in FIG. 1 may comprise the following process steps. For forming a monolithic structure, initially the high-index layers and low-index layers 104, 105 may be formed on the substrate 101, that may be an indium phosphide substrate. A high index layer 104 having a composition as is indicated in Table 1, followed by a low index layer having a composition as indicated by Table 1, such as an indium phosphide layer, may be grown by commonly-used semiconductor epitaxy techniques such as metal organic vapor phase epitaxy, molecular beam epitaxy, or vapor phase epitaxy. After formation of the bottom mirror 103, the first indium phosphide layer 109 may be formed by one of the above-identified epitaxy techniques. Subsequently, the one or more quantum well layers 107 including the barrier layers 108 may be formed as indicated above.

It is well known that the growth of an entire indium phosphide based VCSEL structure with quarternary systems is extremely critical due to the large number of growth parameters to be adjusted. In this respect the present invention provides a significant advantage in comparison to conventional VCSEL devices having an indium phosphide based laser cavity 112 in that the first and second indium phosphide layers are provided. The introduction of the binary material during growth of the VCSEL device efficiently stabilizes the lattice-matched condition and the surface quality. After the formation of the second indium phosphide layer 110, the top mirror 102 may be formed similarly as the bottom mirror 103.

As it is mentioned above, the VCSEL device 100 may also be formed by wafer fusion, wherein, for example, the top mirror 102 and/or the bottom mirror 103 are formed on a GaAs substrate, as in the case of conventional VCSEL devices operating in the low wavelength region, wherein the individual mirrors are then transferred by wafer fusion to each side of a laser cavity formed separately on an InP substrate.

According to a further alternative, the one or more quantum well layers 107 and the barrier layers 108 and the first and second indium phosphide layers 109, 110 may be formed on a GaAs substrate, thereby using the above-mentioned deposition methods.

In these cases, the material compositions as outlined in Table 2 are preferably used. Moreover, the bottom mirror 103 and/or the top mirror 102, but most preferably the top mirror 102, may be formed by depositing dielectric material layers by well-known deposition methods to form a stack of layers having, in an alternating fashion, a high index of refraction and a low index of refraction.

In addition to the advantages provided by the first and second indium phosphide layers 109, 110 during the epitaxial growing of indium phosphide based materials, a further advantage of the present invention arises from the fact that some processes show a large degree of selectivity between indium phosphide and a further material layer. This property has already been applied in lateral confinement demonstrations on indium phosphide lattice matched laser devices, for example, by selectively oxidizing AlAs on indium phosphide lasers, and by selectively wet-etching AlGaInAs materials that are surrounded by indium phosphide layers.

These characteristics of the first and second indium phosphide layers 109, 110 allow to efficiently design the shape of the VCSEL device 100 by exploiting the selective oxidation and wet-etch behavior. In one particular embodiment, selectively wet-etching, for example AlGaInAs material in the presence of indium phosphide is used to form a gap within the laser cavity 112. By means of this gap, the optical length of the laser cavity 112 can be changed either dynamically or statically to finely tune the VCSEL 100 to the required wavelength.

In operation, a current flow is created by correspondingly arranged electrodes (not shown) to trap charge carriers in the quantum wells of the quantum well layers 107. As is well known in the art, the top mirror 102 and/or the bottom mirror 103 may be formed as conductive semiconductor layers to inject the charge carriers into the gain region 106. In embodiments in which dielectric material layers are used in the top mirror 102 and/or the bottom mirror 103, the charge carrier may be injected into the gain region 106 by electrodes that are laterally offset from, for example, the top mirror 102 as is well-known in the art. The charge carriers are then trapped in the quantum wells and are highly efficiently subjected to recombination due to the very efficient confinement of the charge carriers in the quantum well layers 107 sandwiched by the first and second indium phosphide layers 109, 110. In the particular embodiment comprising a laser cavity that is dimensioned to have an optical length substantially coinciding with $(n+\frac{1}{2})\lambda$, the net gain is further enhanced due to the significantly increased overlap of the square of the electrical field with the quantum well layers 107, as is shown in FIG. 2a.

Figure 3:
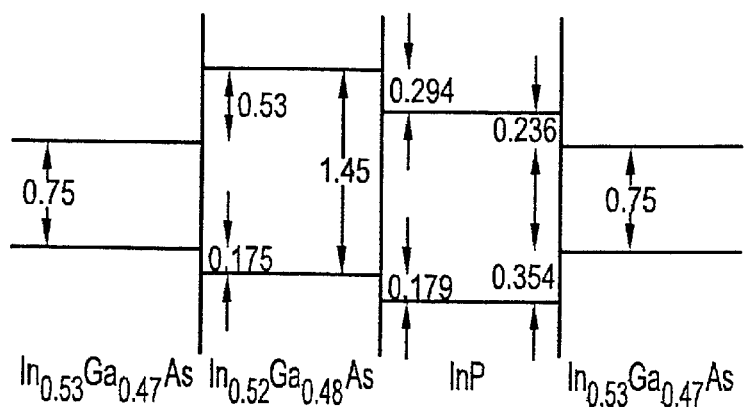
FIG. 3 schematically shows a diagram illustrating the band gap energies of materials lattice-matched to indium phosphide.

In FIG. 3, an example of the conduction band offset for one particular embodiment is shown. In FIG. 3, an InGaAs-based arrangement including an indium phosphide barrier layer is illustrated and exhibits a conduction band offset between the indium phosphide and the InGaAs based layers as high as approximately 0.71 times the energy of the band gap of the InGaAs quantum well layer. Thus, the electron confinement is highly efficient due to the provision of the first and second indium phosphide layers 109, 110 acting as barrier layers bounding the gain region 106, and in particular when additionally indium phosphide layers are used as the barrier layers 108 between subsequent quantum well layers 107.

After recombination of electron-hole pairs within the quantum well layers, the radiation formed within the laser cavity 112 is reflected by the top and bottom mirrors 102, which according to the present invention, exhibit a high reflectivity so that even for a monolithic structure the required reflectivity may be obtained by providing 20–30 high-low index layer pairs. Depending on the reflectivity of the top mirror 102 and the bottom mirror 103, the radiation may be coupled out of the device at the top mirror 102 or at the bottom mirror 103 since, in case an indium phosphide substrate is used as the substrate 101, the radiation in the wavelength range of 1300–1600 nm is transmitted by the substrate 101.

What is claimed is:

1. A vertical-cavity-surface-emitting laser comprising:
a gain region;
a first mirror and a second mirror, the first and second mirror defining a resonator;
a first substantially undoped indium phosphide layer adjacent to said gain region; and
a second substantially undoped indium phosphide layer adjacent to said gain region, wherein the first and second substantially undoped indium phosphide layers sandwich said gain region to define a laser cavity,
wherein an optical thickness of the laser cavity in the longitudinal dimension is approximately $(n+\frac{1}{2})$ times $\lambda$, wherein n is an integer number and $\lambda$ is the output wavelength of the vertical-cavity surface-emitting laser.

2. The vertical-cavity surface-emitting laser of claim 1, wherein said laser cavity is formed by the first substantially undoped indium-phosphide layer, the gain region and the second substantially undoped indium phosphide layer.

3. The vertical-cavity surface-emitting laser of claim 2, wherein said one or more quantum well layers are designed to have energy eigenvalues to generate radiation in the wavelength range from approximately 1300–1600 nm.

4. The vertical-cavity surface-emitting laser of claim 1, wherein said one or more quantum well layers are designed to have energy eigenvalues to generate radiation in the wavelength range from approximately 1000 nm–2000 nm.

5. The vertical-cavity surface-emitting laser of claim 1, wherein the first and second mirror means are positioned to stabilize radiation of a wavelength of approximately 1300 nm or of approximately 1550 nm.

6. The vertical-cavity surface-emitting laser of claim 1, further comprising a substrate supporting said quantum well layers, the first and second mirror means and the laser cavity.

7. The vertical-cavity surface-emitting laser of claim 6, wherein said substrate is substantially an indium phosphide substrate.

8. The vertical-cavity surface-emitting laser of claim 6, wherein said substrate is substantially a gallium arsenide substrate.

9. The vertical-cavity surface-emitting laser of claim 1, wherein said one or more quantum well layers are formed of a material composition including indium, gallium and arsenic.

10. The vertical-cavity surface-emitting laser of claim 9, wherein said material composition further comprises aluminum to adjust characteristics of the one or more quantum well layers according to design requirements.

11. The vertical-cavity surface-emitting laser of claim 9, wherein said material composition further comprises phosphorous to adjust characteristics of the quantum well layers according to design requirements.

12. The vertical-cavity surface-emitting laser of claim 1, further comprising a pair of barrier layers arranged to sandwiching at least one of the one or more quantum well layers.

13. The vertical-cavity surface-emitting laser of claim 12, wherein said barrier layers comprise indium phosphide or a compound of indium, gallium, aluminum, arsenic or a compound of indium, gallium, arsenic, phosphorous.

14. The vertical-cavity surface-emitting laser of claim 1, wherein at least one of the first and second mirror means comprises layers of low refractive index and high refractive index in an alternating fashion.

15. The vertical-cavity surface-emitting laser of claim 14, wherein the layers of low refractive index comprise one of indium phosphide and a compound of indium, aluminum, arsenic, and a compound of aluminum, arsenic, antimony, and a compound of aluminum, phosphorous, antimony.

16. The vertical-cavity surface-emitting laser of claim 14, wherein said layer of low refractive index additionally comprises gallium to adjust the characteristics of said layer of low refractive index according to design requirements.

17. The vertical-cavity surface-emitting laser of claim 14, wherein the layers of low refractive index comprise aluminum arsenide.

18. The vertical-cavity surface-emitting laser of claim 17, wherein the layers of low refractive index additionally comprise gallium to adjust the characteristics of the layers of low refractive index according to design requirements.

19. The vertical-cavity surface-emitting laser of claim 14, wherein the layers of high refractive index comprise one of a compound of indium, gallium, aluminum, arsenic, and a compound of indium, gallium, arsenic, phosphorous, and a compound of aluminum, gallium, arsenic, antimony, and a compound of aluminum, gallium, phosphorous, antimony.

20. The vertical-cavity surface-emitting laser of claim 14, wherein the layers of high refractive index comprise gallium arsenide.

21. The vertical-cavity surface-emitting laser of claim 20, wherein the layers of high refractive index additionally comprise aluminum to adjust characteristics of said layers of high refractive index according to design requirements.

22. The vertical-cavity surface-emitting laser of claim 14, wherein the layers of low refractive index and the layers of high refractive index are formed of dielectric materials.

23. The vertical-cavity surface-emitting laser of claim 22, wherein the layers of low refractive index comprise at least one of magnesium fluoride, calcium fluoride, strontium fluoride, silicon dioxide and aluminum oxide.

24. The vertical-cavity surface-emitting laser of claim 23, wherein the layers of high refractive index comprise at least one of tantalum oxide, zinc, selenium, titanium dioxide and silicon.

25. The vertical-cavity surface-emitting laser of claim 22, wherein the layers of high refractive index comprise at least one of tantalum oxide, zinc, selenium, titanium dioxide and silicon.

26. The vertical-cavity surface-emitting laser of claim 1, further comprising one or more heat distribution layers to transversely conduct heat from the quantum well layers to the periphery of the vertical-cavity surface-emitting laser.

27. The vertical-cavity surface-emitting laser of claim 26, wherein at least one heat distribution layer is formed adjacent to the laser cavity.

28. The vertical-cavity surface-emitting laser of claim 26, wherein said one or more heat distribution layers comprise indium phosphide.

29. The vertical-cavity surface-emitting laser of claim 26, wherein said one or more heat distribution layers are formed in at least one of the first mirror means and the second mirror means.

30. A vertical-cavity-surface-emitting laser comprising:
a gain region;
a first reflector and a second reflector, the first and second reflector defining a resonator;
a first substantially undoped indium phosphide layer adjacent to said gain region; and
a second substantially undoped indium phosphide layer adjacent to said gain region, wherein the first and second substantially undoped indium phosphide layers sandwich said gain region to define a laser cavity.

31. A vertical-cavity-surface-emitting laser comprising:
a gain region;
a first reflector and a second reflector, said first and second reflector defining a resonator;
a first substantially undoped indium phosphide layer adjacent to said gain region, said first substantially undoped indium phosphide layer having a first refractive index;
a second substantially undoped indium phosphide layer adjacent to said gain region, said second substantially undoped indium phosphide layer having a second refractive index wherein the first and second substantially undoped indium phosphide layers sandwich said gain region to define a laser cavity; and
means, associated with said gain region, for centering a maximum intensity of an electric field within said gain region,
whereby a stimulated emission rate is maximized.

32. A vertical-cavity-surface-emitting laser as in claim 31 wherein:
said first reflector and said second reflector comprises alternating low index layers having a low refractive index and high index layers having a high refractive index; and
the first refractive index of said first substantially undoped indium phosphide layer and the second refractive index of said second substantially undoped indium phosphide layer are lower than the high refractive index of the high index layers of said first and second reflectors.

33. A vertical-cavity-surface-emitting laser as in claim 32 wherein:
the first refractive index of said first substantially undoped indium phosphide layer and the second refractive index of said second substantially undoped indium phosphide layer are only slightly larger than the low refractive index of the low index layers of said first and second reflectors.

34. A vertical-cavity-surface-emitting laser as in claim 31 wherein:
an optical thickness of the laser cavity in a longitudinal dimension is approximately $(n+\frac{1}{2})$ times $\lambda$, wherein n is an integer number and $\lambda$ is an output wavelength of the vertical-cavity surface-emitting laser.

35. A vertical-cavity-surface-emitting laser as in claim 31 wherein:
the first refractive index of said first substantially undoped indium phosphide layer and the second refractive index of said second substantially undoped indium phosphide layer are approximately 3.17.

* * * * *